US008305825B2

(12) United States Patent
van Winkelhoff et al.

(10) Patent No.: US 8,305,825 B2
(45) Date of Patent: Nov. 6, 2012

(54) TIMING CONTROL CIRCUIT

(75) Inventors: Nicolaas Klarinus Johannes van Winkelhoff, Villard-Bonnot (FR); Bastien Jean Claude Aghetti, Grenoble (FR)

(73) Assignee: ARM Limited, Cambridge (GB)

( * ) Notice: Subject to any disclaimer, the term of this patent is extended or adjusted under 35 U.S.C. 154(b) by 279 days.

(21) Appl. No.: 12/805,566

(22) Filed: Aug. 5, 2010

(65) Prior Publication Data
US 2012/0036335 A1    Feb. 9, 2012

(51) Int. Cl.
*G11C 7/22* (2006.01)
*G06F 1/04* (2006.01)
*G06F 7/22* (2006.01)
(52) U.S. Cl. ............ 365/210.1; 365/191; 711/167; 711/E12.001; 327/299
(58) Field of Classification Search ............ None
See application file for complete search history.

(56) References Cited

U.S. PATENT DOCUMENTS 7,010,440 B1 * 3/2006 Lillis et al. ............ 702/65
7,263,004 B2 * 8/2007 Chen ............ 365/185.25

* cited by examiner

*Primary Examiner* — Huan Hoang
*Assistant Examiner* — James G Norman
(74) *Attorney, Agent, or Firm* — Nixon & Vanderhye P.C.

(57) ABSTRACT

A timing control circuit comprises at least three current control units coupled in parallel between a first circuit and a second circuit node. The current control units each have an active mode and an inactive mode. The current control units are responsive to a timing trigger event to pass current whose magnitude is dependent on how many of the current control units are in the active mode. The current control units comprise a plurality of groups. Current control units within a same group are responsive to a change in a bit of a control value corresponding to that group to switch together between the active and inactive modes, such that the magnitude of the current is dependent on which of the groups are in the active mode. The signal timing in the associated circuit is varied in dependence on the magnitude of the current.

24 Claims, 10 Drawing Sheets

TIMING CONTROL CIRCUIT

BACKGROUND OF THE INVENTION

1. Field of the Invention

The present invention relates to the field of data processing. More particularly, the invention relates to a timing control circuit for controlling a signal timing in an associated circuit.

2. Description of the Prior Art

In a data processing system, it can be useful to control a signal timing within a circuit of the data processing system. For example, it may not be easy to predict in advance which timings should be used since the ideal signal timing may vary from system to system depending on the configuration of circuit elements used in the system, manufacturing process variations and other characteristics of the system. Also, it may be desirable to provide reference timings that can varied in accordance with application requirements. For example, a more aggressive scheduling with a shorter delay between reference timings can increase performance, while for a safety-critical application the timings can be relaxed in order to reduce the likelihood of errors. Hence, a tunable timing control circuit for controlling reference timings for an associated circuit may be desirable.

In a memory, for example, reference timings can be controlled using a dummy loop circuit. The dummy loop circuit has a dummy cell that mimics a real memory cell of the memory array. When a dummy word line of the dummy cell is asserted, then a dummy sense amplifier reads a dummy value from the dummy cell over a dummy bit line. The timing with which the dummy value is returned from the dummy cell is correlated with the timing of similar operations within the memory array and so can be used to trigger events in the memory array, such as the triggering of a sense amplifier or the resetting of a word line.

To vary the reference timing provided by the dummy loop circuit, the dummy cell may be provided with a number of switchable control cells which can be switched on and off individually in order to increase or decrease the current flow through the dummy loop. When a greater number of control cells are switched into the path of the dummy loop, more current flows through the dummy loop, causing the dummy loop to return its data value more quickly and hence triggering the generation of the reference timing at an earlier time.

However, providing such variable timing control requires a large amount of circuit area. Typically, a decoder is provided to convert a control value, which specifies the number of control cells that are to be switched on in the dummy loop path, into signals for switching each individual control cell. For example, if there are 16 control cells, then this requires a 4:16 decoder which converts a 4-bit binary value into 16 1-bit signals for switching the individual cells. The 4:16 decoder requires many transistors (typically about 136 transistors). This area overhead is expensive and contributes greatly to the total circuit area of the memory. Hence, it is desirable to reduce the area overhead associated with the timing control.

SUMMARY OF THE INVENTION

Viewed from one aspect, the present invention provides a timing control circuit for controlling a signal timing in an associated circuit, the timing control circuit comprising:
a first circuit node;
a second circuit node;
a control input for receiving a control value; and
at least three current control units coupled in parallel between said first circuit node and said second circuit node, said current control units being responsive to a timing trigger event to pass a current, said signal timing of said associated circuit being dependent on a magnitude of said current; wherein:
said current control units each have an active mode and an inactive mode, said magnitude of said current being dependent on how many of said current control units are in said active mode at the time of said timing trigger event;
said current control units comprise a plurality of groups of current control units, at least two of said groups having different numbers of current control units, at least one of said groups comprising more than one current control unit; said control value comprises a plurality of bits corresponding to said plurality of groups of current control units; and
current control units within a same group are responsive to a change in a bit of said control value corresponding to that group to switch together between said active mode and said inactive mode, such that said magnitude of said current is dependent on which of said groups of current control units are in said active mode at the time of said timing trigger event.

A timing control circuit comprises at least three current control units which are coupled in parallel between a first circuit node and a second circuit node. The current control units have an active mode and an inactive mode. On occurrence of a timing trigger event, the current control units pass a current whose magnitude is dependent on how many of the current control units are in the active mode at the time of the timing trigger event. Current control units which are in the inactive mode do not contribute significantly to the magnitude of the current. The signal timing of the associated circuit is controlled in dependence on the magnitude on the current.

An improved technique is provided for controlling which current control units are actively contributing to the magnitude of the current, and which of the current control units are inactive. The current control units are divided into a plurality of groups of current control units. At least two of the groups have different numbers of current control units and at least one of the groups has more than one current control unit. The current control units within a same group are switched together between the active mode and the inactive mode. A control value is received which comprises a plurality of bits corresponding to the plurality of groups. Each bit of the control value controls whether a corresponding group of current control units is active or inactive. According to the control value, different combinations of groups can be switched into the active mode to provide a range of different numbers of active current control units. Hence, the magnitude of the current can be adjusted to be within a range of different magnitudes, and the signal timing of the associated circuit is tuneable within a corresponding range.

As the bits of the control value directly control whether corresponding groups of control units are in an active mode or an inactive mode, there is no need for a decoder for converting the control value into individual signals for switching each control unit. Hence the area overhead associated with a timing control circuit can be reduced. For example, in one embodiment a tunable timing control circuit having 15 control units can be provided with as few as 19 transistors.

The number of current control units within each group can be varied according to design need. However, a particularly useful embodiment provides N groups of current control units, where a $j^{th}$ group of said N groups comprises $2^j$ current control units, where $0 \leq j \leq N-1$. Hence, the respective groups comprise numbers of current control units which scale in a binary fashion as 1, 2, 4, 8, etc. In binary arithmetic, any integer can be formed as the sum of powers of two. For example, the value 9 is equivalent to $2^0 + 2^3$ (1+8). In a similar way, any desired number of current control units can be switched into the active mode by selecting the appropriate combination of groups. Nine active current control units may be provided by switching into the active mode the group having one current control unit and the group having eight current control units, and leaving other groups inactive.

Using a binary scaling of group sizes in this way enables a regular sequence of numbers of active control units (1, 2, 3, 4, 5, . . . ) to be provided. Moreover, the binary scaling of group sizes also ensures that each value of the control value corresponds to a unique number of active current control units, and so provides an efficient encoding of the control value.

The control value may comprise N bits [N−1:0], and the $j^{th}$ group may be controlled to be in the active mode or the inactive mode in dependence on the $j^{th}$ bit (bit [j]) of control value. The notation [N−1:0] indicates that the least significant bit of the N bits is the $0^{th}$ bit and the most significant bit is the $(N-1)^{th}$ bit. For example, where N=4, then bit [3] of the control value [3:0] would control the group having $2^3=8$ control units, bit [2] would control the group having $2^2=4$ control units, and so on. This is useful because the control value then becomes a binary value indicating the total number of current control units that are to be placed in the active mode (or inactive mode). Hence, this encoding of the control value is easy to understand and efficient.

In one embodiment, a bit value of 1 may indicate that the corresponding group is to be placed in the active mode, while a bit value of 0 may indicate that the corresponding group is to be placed in the inactive mode. For example, a control value 0b0111 would indicate 7 active control units by switching into the active mode the groups comprising 4, 2 and 1 current control units. Hence, the control value simply indicates the total number of current control units in the active mode.

Alternatively, the meanings of "0" and "1" in the control value may be reversed so that "0" indicates the active mode and "1" indicates the inactive mode. In this case, the control value indicates the total number of inactive current control units.

Optionally, in addition to the N groups having 1, 2, 4, . . . , $2^{N-1}$ control units, there may also be one or more other groups which do not scale in a binary fashion.

In an embodiment, the timing control circuit may comprise at least one further current control unit coupled in parallel with the at least three current control units between the first and second circuit nodes. The further current control unit may be configured to pass a further current independently of the control value. Unlike the at least three current control units, which may be switched between the active and inactive modes, the further current control unit passes the further current in response to the trigger events regardless of the present value of the control value.

This can be useful because the further current control unit can provide a fixed offset to the magnitude of the current passed for each possible value of the control value. Also, the further current control unit enables an additional increment to be added to the range of possible signal timings provided by the timing control circuit, because the further current control unit enables a current to pass between the first and second circuit nodes even when all of the current control units are in the inactive mode. Hence, adding the further current control unit provides greater flexibility in variation of the signal timing.

The current passed by the current control units may be either a charging current or a discharge current passing between the first and second circuit nodes. For example, the second circuit node, say, may be coupled to a supply level, and a discharge current could then discharge the first circuit node towards the supply level when the timing trigger event occurs while at least one of the current control units is in the active mode. Alternatively, one of the circuit nodes could be charged by a charging current flowing from the other circuit node.

The signal timing in the associated circuit may be dependent on the rate at which one of the first and second circuit nodes is charged or discharged by the current. For example, the signal timing may be triggered when one of the first and second circuit nodes is charged or discharged beyond a threshold voltage level. Hence, by switching more current control units into the active mode, the rate of charge or discharge of the circuit node is increased due to the increased magnitude of current flowing between the first and second circuit nodes. This causes the circuit node to pass the threshold voltage at an earlier time and so the reference timing is triggered earlier. Conversely, switching more current control units into the inactive mode reduces the rate of charge/discharge and so prolongs the period required to charge/discharge the circuit node beyond the threshold level, and so the reference timing will be initiated later.

In another embodiment, the first circuit node may be coupled to a capacitive element, and the signal timing in the associated circuit may be dependent on a rate of charge or discharge of the capacitive element by the current. For example, the associated circuit could trigger the signal timing when the voltage difference across capacitive element is charged or discharged beyond a threshold amount. The capacitive element may be a capacitor or any other element of a circuit having capacitance.

In an embodiment, the associated circuit comprises a memory and the timing control circuit comprises a dummy loop circuit for controlling a reference timing for the memory. The dummy loop circuit may mimic a real read/write path within the memory so as to act as a reference for timings within the memory. For example, the reference timing may be a timing for triggering a sense amplifier to begin detecting a read data value, or may control the time at which a word line is reset. By providing a dummy loop circuit in which a group of current control units is switched collectively between the active and inactive modes in dependence on a corresponding bit of the control value as described above, the area overhead associated with providing a dummy loop circuit with variable reference timing can be reduced.

The dummy loop circuit may comprise a dummy bit line and a dummy word line, with the first circuit node being coupled to the dummy bit line, the second circuit node being coupled to a supply level and the timing trigger event comprising asserting the dummy word line. When the dummy word line is asserted, then a current is passed between the dummy bit line and the supply level via any current control units that are currently in the active mode. The magnitude of the current is dependent on the number of current control units that are in the active mode. When the current charges or discharges the dummy bit line beyond a threshold amount, then a timing in the memory can be triggered. For example, a dummy sense amplifier similar to the sense amplifiers used in the memory can be used to detect the change in level on the dummy bit line and so trigger the reference timing in the memory. As the dummy bit line, dummy word line and dummy sense amplifier are similar to the corresponding features of the memory, the reference timing correlates to the preferred signal timing within the memory. Nevertheless, by varying the number of active control units, the reference timing can be adjusted to account for process variation in the memory, differing sizes of word lines and bit lines and other elements of the memory, or scheduling requirements, for example.

The current control units may have various forms. In one example, each current control unit comprises a trigger transistor responsive to a timing trigger signal indicating the timing trigger event to allow the current to pass between the first and second circuit nodes if the current control unit is in the active mode. For example, the trigger transistors may become conductive when the timing trigger event occurs, so that a current can pass through the trigger transistor if the current control unit is in the active mode. In the example of the dummy loop circuit, the timing trigger signal may be the assertion of the dummy word line.

Within a selected group of current control units, each current control unit within said selected group may comprise a control transistor coupled in series with said trigger transistor and each control transistor may be configured to select whether the corresponding current control unit is in said active mode or said inactive mode in dependence on the bit of said control value corresponding to said selected group. For such a selected group of current control units, the trigger transistor and control transistor coupled in series within each current control unit allow a current to pass if both the trigger event has occurred (rendering the trigger transistor conductive) and the current control unit is in the active mode (rendering the control transistor conductive). This configuration of current control unit is particularly useful in the embodiment of a dummy loop circuit because the two transistors of the current control unit mimic similar transistors of a typical memory cell.

Alternatively, within a selected group of current control units, a shared control transistor may be coupled in series with the trigger transistors of each current control unit within said selected group and said shared control transistor may be configured to select whether the current control units within said selected group are in said active mode or said inactive mode in dependence on the bit of said control value corresponding to said selected group. By sharing a control transistor between the current control units within a selected group, the number of transistors provided in the timing control circuit can be reduced.

The "selected group" of current control units mentioned above may be any one or more of the groups of current control units. In the subsequently explained embodiments, it is assumed that either all groups have multiple individual transistors for each current control unit within the group, or all groups have a shared control transistor that is shared between current control units. However, it will be appreciated that it is also possible to provide some groups with a multiple individual control transistors and other groups with a shared control transistor.

In an embodiment, the timing control circuit may comprise a plurality of second circuit nodes, with each of the second circuit nodes having at least one group of current control units coupled between the first circuit node and that second circuit node. For example, in some cases the timing circuit may fit better within the area constraints of an integrated circuit if separate second circuit nodes are provided for different groups, rather than connecting all of the groups of current control units to the same second circuit node.

In an embodiment, the associated circuit may be a ring oscillator circuit, and the timing control circuit may be a circuit for regulating an oscillation period of the ring oscillator circuit in dependence on the magnitude of the current. The ring oscillator circuit typically has a ring-shaped signal path whose value oscillates between two signal values. By drawing more or less current from the ring oscillator circuit as different numbers of current control units are switched between the active and inactive modes, the timing control circuit according to the present technique can regulate the oscillation period of the ring oscillator circuit.

In one embodiment, said first circuit node may be coupled to a signal path of said ring oscillator circuit, said second circuit node may be coupled to a supply level, and said timing trigger event may comprise a predetermined transition of a signal value on said signal path of said ring oscillator circuit. Each current control unit may comprise a capacitive element coupled between said signal path of said ring oscillator circuit and said supply level; and on occurrence of said predetermined transition, the capacitive elements of current control units that are in said active mode may be charged by said current such that the magnitude of said current is dependent on how many of said current control units are in said active mode.

In this embodiment, the signal path of the ring oscillator circuit transitions between different signal values. Following a predetermined transition of the signal path, a current is drawn from the signal path such that capacitive elements within the active current control units are charged by the current. The greater the number of current control units that are in the active mode, the greater the magnitude of the current charging the capacitive elements, and so the smaller the magnitude of the current flowing on the signal path. Hence, elements within the signal path of the ring oscillator will be charged or discharged more slowly and so the oscillation period of the ring oscillator will become longer. Conversely, by passing a control value to the timing control circuit which controls fewer current control units to be placed in the active mode, a smaller current is drawn from the ring oscillator and so the ring oscillator transitions more quickly and the oscillation period becomes shorter. Hence the present technique can be used to regulate the oscillation period of the ring oscillator circuit.

In an embodiment, within a selected group of current control units, each current control unit within said selected group may comprise a control transistor coupled in series with said capacitive element and each control transistor may be configured to select whether the corresponding current control unit is in said active mode or said inactive mode in dependence on the bit of said control value corresponding to said selected group. Hence, each current control unit may be provided with its own control transistor for controlling whether or not the corresponding capacitive element is charged by the current from the ring oscillator circuit.

Alternatively, within a selected group of current control units, a shared control transistor may be coupled in series with the capacitive elements of each current control unit within said selected group and said shared control transistor may be configured to select whether the current control units within said selected group are in said active mode or said inactive mode in dependence on the bit of said control value corresponding to said selected group. In this embodiment, a control transistor is shared between different current control units for controlling whether the capacitive elements of those current control units are charged by the current from the ring oscillator circuit.

Viewed from a further aspect, the present invention provides a processing apparatus comprising a timing control circuit as described above and the associated circuit, wherein the reference timing of the associated circuit is configured to be controlled in dependence on the magnitude of the current of the timing control circuit.

Viewed from a further aspect, the present invention provides a memory comprising a memory array and a dummy loop circuit for generating a reference timing for said memory array, said dummy loop circuit comprising:

a dummy word line;
a dummy bit line;
a control input for receiving a control value; and
at least three current control units coupled in parallel between said dummy bit line and a supply level, said current control units being responsive to assertion of said dummy word line to pass a current between said dummy bit line and said supply level; wherein:
said current control units each have an active mode and an inactive mode, said magnitude of said current being dependent on how many of said current control units are in said active mode when said dummy word line is asserted; said current control units comprise a plurality of groups of current control units, at least two of said groups having different numbers of current control units, at least one of said groups comprising more than one current control unit;
said control value comprises a plurality of bits corresponding to said plurality of groups of current control units; and current control units within a same group are responsive to a change in a bit of said control value corresponding to that group to switch together between said active mode and said inactive mode, such that said magnitude of said current is dependent on which of said groups of current control units are in said active mode when said dummy word line is asserted; and
said reference timing for said memory array is dependent on said magnitude of said current passed by said current control units of said dummy loop circuit.

Viewed from another aspect, the present invention provides a memory compiler for compiling a memory comprising a memory array and a dummy loop circuit for generating a reference timing for said memory array, said dummy loop circuit comprising:

a dummy word line;
a dummy bit line;
a control input for receiving a control value;
and at least three current control units coupled in parallel between said dummy bit line and a supply level, said current control units being responsive to assertion of said dummy word line to pass a current between said dummy bit line and said supply level; wherein:
said current control units each have an active mode and an inactive mode, said magnitude of said current being dependent on how many of said current control units are in said active mode when said dummy word line is asserted;
said current control units comprise a plurality of groups of current control units, at least two of said groups having different numbers of current control units, at least one of said groups comprising more than one current control unit; said control value comprises a plurality of bits corresponding to said plurality of groups of current control units;
current control units within a same group are responsive to a change in a bit of said control value corresponding to that group to switch together between said active mode and said inactive mode, such that said magnitude of said current is dependent on which of said groups of current control units are in said active mode when said dummy word line is asserted; and
said reference timing for said memory array is dependent on said magnitude of said current passed by said current control units of said dummy loop circuit.

A memory compiler is a tool used for compiling a design of a memory. At the to time of compiling the design, memory characteristics such as the number of memory cells and the size of word lines and bit lines may not be known, since the memory design may be scalable for different numbers of memory cells, different word sizes, etc. The preferred reference timing used for the eventual memory will be dependent on such characteristics of the memory and so the memory compiler cannot predetermine the preferred reference timing.

To enable the memory compiler to produce a memory design which can be used for different sizes of memory arrays, the present technique allows the memory compiler to compile a memory having a dummy loop circuit which controls the reference timing according to the present technique. Hence, the reference timings may be adjusted in the eventually implemented memory array. Since the dummy loop circuit has current control units which are switched collectively in groups between active and inactive modes, the area overhead associated with this design of dummy loop circuit is low in comparison to previous systems where each current control unit is switched individually. Hence, the memory compiler is able to produce memory designs having low area overhead.

The present invention also provides a non-transitory recording medium storing program instructions for causing a computer to execute the memory compiler.

Viewed from yet another aspect, the present invention provides a timing control circuit for controlling a signal timing in an associated circuit, the timing control circuit comprising:

a first circuit node;
a second circuit node;
control input means for receiving a control value; and
at least three current control means, coupled in parallel between said first circuit node and said second circuit node, for passing a current in response to a timing trigger event, said signal timing of said associated circuit being dependent on a magnitude of said current; wherein:
said current control means each have an active mode and an inactive mode, said magnitude of said current being dependent on how many of said current control means are in said active mode at the time of said timing trigger event;
said current control means comprise a plurality of groups of current control means, at least two of said groups having different numbers of current control means, at least one of said groups comprising more than one current control means;
said control value comprises a plurality of bits corresponding to said plurality of groups of current control means; and
current control means within a same group are responsive to a change in a bit of said control value corresponding to that group to switch together between said active mode and said inactive mode, such that said magnitude of said current is dependent on which of said groups of current control means are in said active mode at the time of said timing trigger event.

Viewed from a further aspect, the present invention provides a method of controlling a signal timing in an associated circuit using a timing control circuit comprising at least three current control units coupled in parallel between a first circuit node and a second circuit node, said current control units comprising a plurality of groups of current control units, at least two of said groups having different numbers of current control units, at least one of said groups comprising more than one current control unit; the method comprising:

receiving a control value comprising a plurality of bits corresponding to said plurality of groups of current control units;

in response to a change in a bit of said control value corresponding to a group of current control units, switching current control units within that group between an active mode and an inactive mode;

in response to a timing trigger event, allowing a current to be passed by the current control units that are in said active mode such that a magnitude of said current is dependent on which of said groups of current control units are in said active mode at the time of said timing trigger event;

and controlling said signal timing of said associated circuit in dependence on said magnitude of said current.

The above, and other objects, features and advantages of this invention will be apparent from the following detailed description of illustrative embodiments which is to be read in connection with the accompanying drawings.

DESCRIPTION OF EMBODIMENTS

Figure 1:
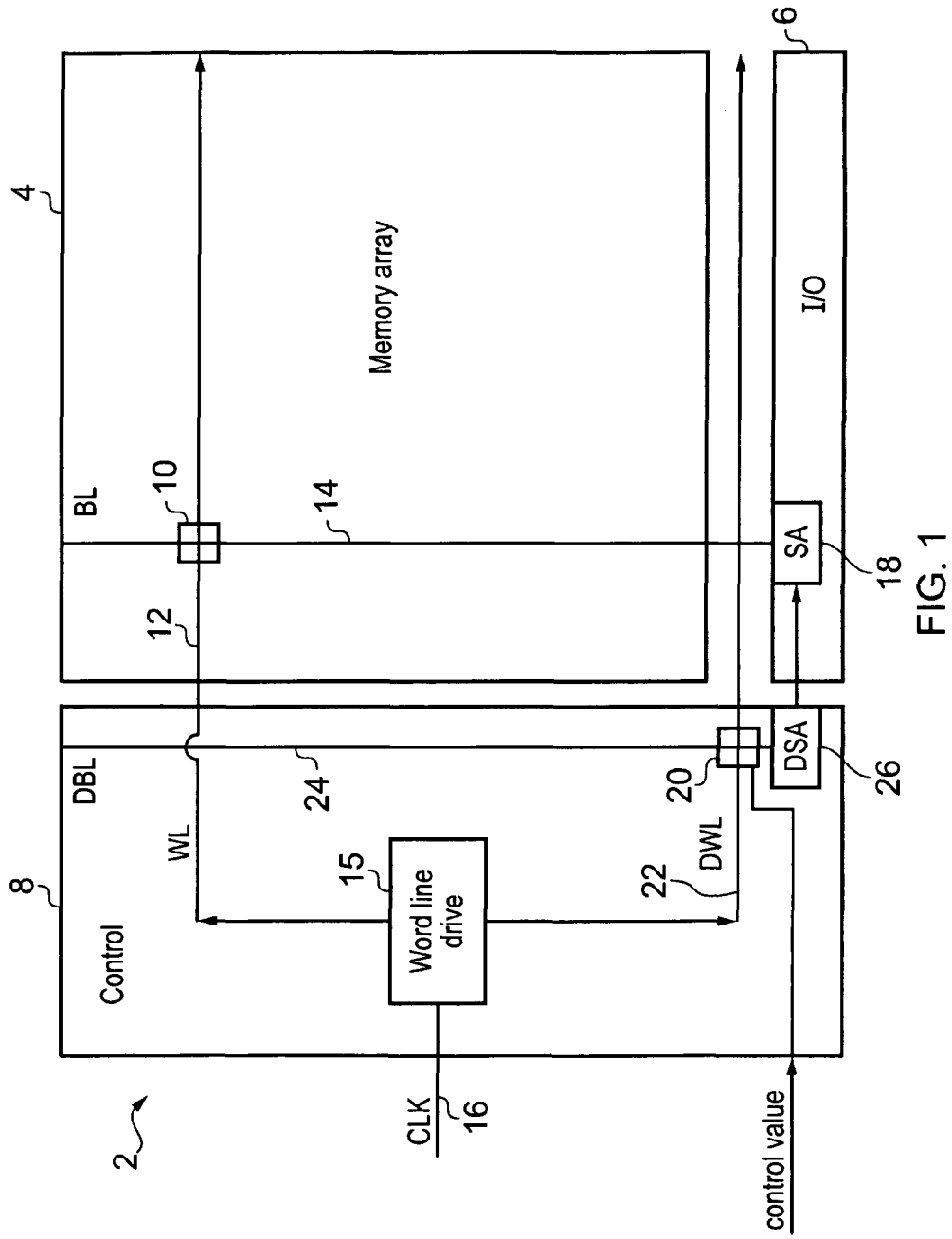
FIG. 1 schematically illustrates a memory comprising a memory array and a dummy loop circuit according to one embodiment.

FIG. 1 schematically illustrates a memory 2 comprising a memory array 4, an input/output (I/O) unit 6 and a control unit 8. The memory array 4 comprises an array of memory cells 10 for storing data values. Each memory cell 10 has a corresponding word line 12 and bit line 14 which are used to select the desired memory cell 10 during a read operation or write operation. During a read or write operation, the word line 12 for the desired memory cell 10 is driven by a word line drive unit 15 within the control unit 8 in response to a clock signal 16. For a read operation, the data value in the memory cell 10 is read from the bit line 14 by a sense amplifier 18 within the input/output unit 6. For a write operation, a data value is asserted on the bit line 14 and stored to the memory cell 10.

Reference timings for controlling memory operations within the memory array 4 are controlled by a dummy loop circuit. The dummy loop circuit comprises a dummy cell 20, dummy word line 22, dummy bit line 24 and dummy sense amplifier 26, which mimic the corresponding features of the real memory cell 10 within the memory array 4.

Figure 2:
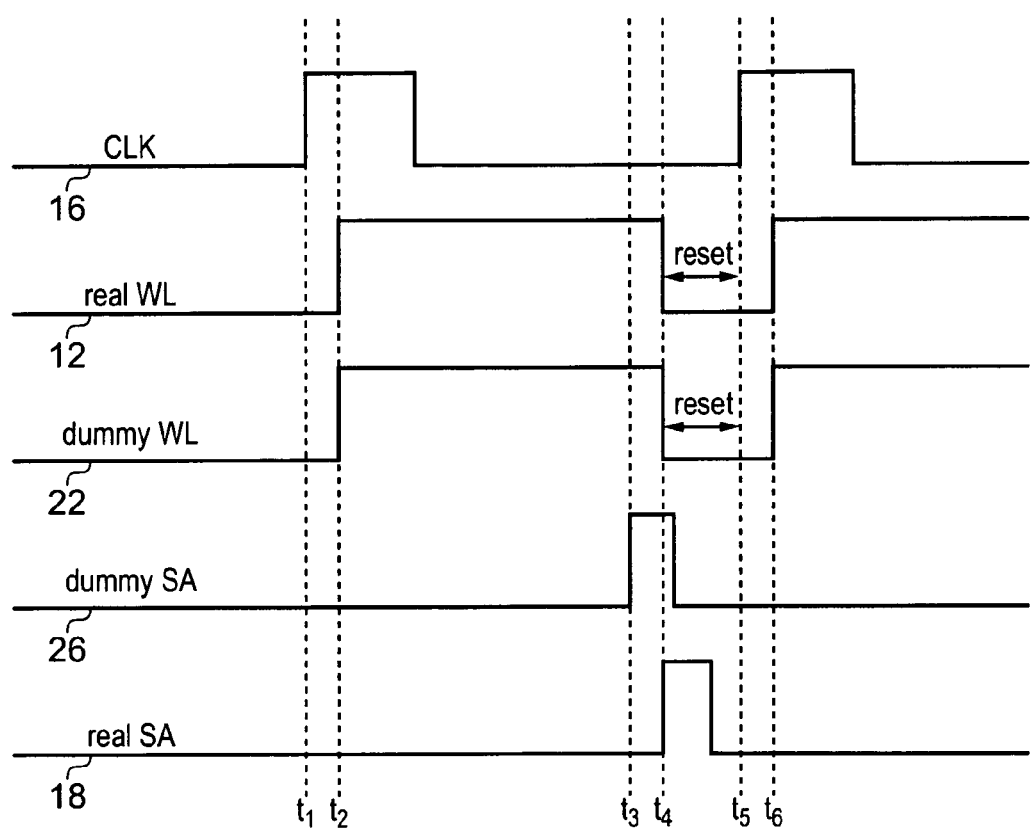
FIG. 2 illustrates signal timings within the memory of FIG. 1.

FIG. 2 schematically illustrates how reference timings within the memory 2 can be controlled in dependence on the dummy loop circuit. In response to a rising edge of the clock signal 16 at time $t_1$, the word line driver 15 asserts both the real word line 12 and the dummy word line 22 at time $t_2$. There is a small delay between times $t_1$ and $t_2$ owing to the signal propagation delays through the word line driver 15 and word lines 12, 22.

Following assertion of the real and dummy word lines 12, 22, it takes a finite length of time before the value from the real memory cell 10 and dummy cell 20 can be read by the sense amplifier 18 and dummy sense amplifier 26 from their respective bitlines. Typically, the dummy cell 20 and dummy sense amplifier are designed to produce the dummy output slightly earlier than the real output from real memory cell 10 and sense amplifier 18 with a timing that is correlated to the time required for the real memory cell 10. For example, the dummy output may be arranged to be 10-20% faster than the real output. At time $t_3$ the dummy sense amplifier 26 is enabled to determine the dummy output value from the dummy bitline 24. In response to this determination by the dummy sense amplifier 26, the real sense amplifier 18 is triggered at time $t_4$ to determine the real output value from the bitline 14. Hence, the dummy loop circuit controls the reference timing for firing up the real sense amplifier 18, to ensure that the real sense amplifier 18 is triggered at a suitable time to be able to determine the output value of the memory cell 10.

Having detected the output values from the real and dummy bit cells 10, 20 then the word lines 12, 22 need to be reset ready for a new memory access in the next clock cycle. Hence, the detection of the dummy value by the dummy sense amplifier 26 can also be used to trigger a reset of the real word line 12 and dummy word line 22. Following detection of the dummy value at time $t_3$, at $t_4$ the real and dummy word lines 12, 22 are reset. The next cycle of the clock signal 16 can then be arranged to begin at time $t_5$ when the reset is complete.

Hence we can see from FIG. 2 that the dummy loop circuit can control the reference timings for various memory operations such as triggering a sense amplifier 18 or resetting a word line 12. This reference timing is dependent on the time taken for the dummy cell 20 to return its output value. It may be desirable to be able to tune the delay provided by the dummy bit cell 20 so that the reference timing for the memory cell can be varied.

For example, the same control unit 8 may be used with a variety of different sized memory arrays 4. The delay associated with a memory access in the memory array 4 will be dependent on factors such as the length of the bit line and word line and the capacitance of various elements within the memory array. Hence, the dummy loop circuit may be tuneable so as to provide a reference timing that can be adjusted to account for the particular configuration of memory array 4 being used. Moreover, for performance or error protection reasons it may be desirable to tune the dummy loop circuit to provide different levels of reference timing. For example, if high performance is desired then the delay provided by the dummy loop circuit could be reduced so that reference timings within the memory are triggered earlier than would otherwise be the case. Alternatively, for a safety critical application where it is important that few errors occur, then the timings of the dummy circuit could be relaxed so that the memory array 4 has more time to complete its operations. Hence, there are a number of reasons why tuneable dummy loop circuits may be used to provide a variable reference timing.

Figure 3:
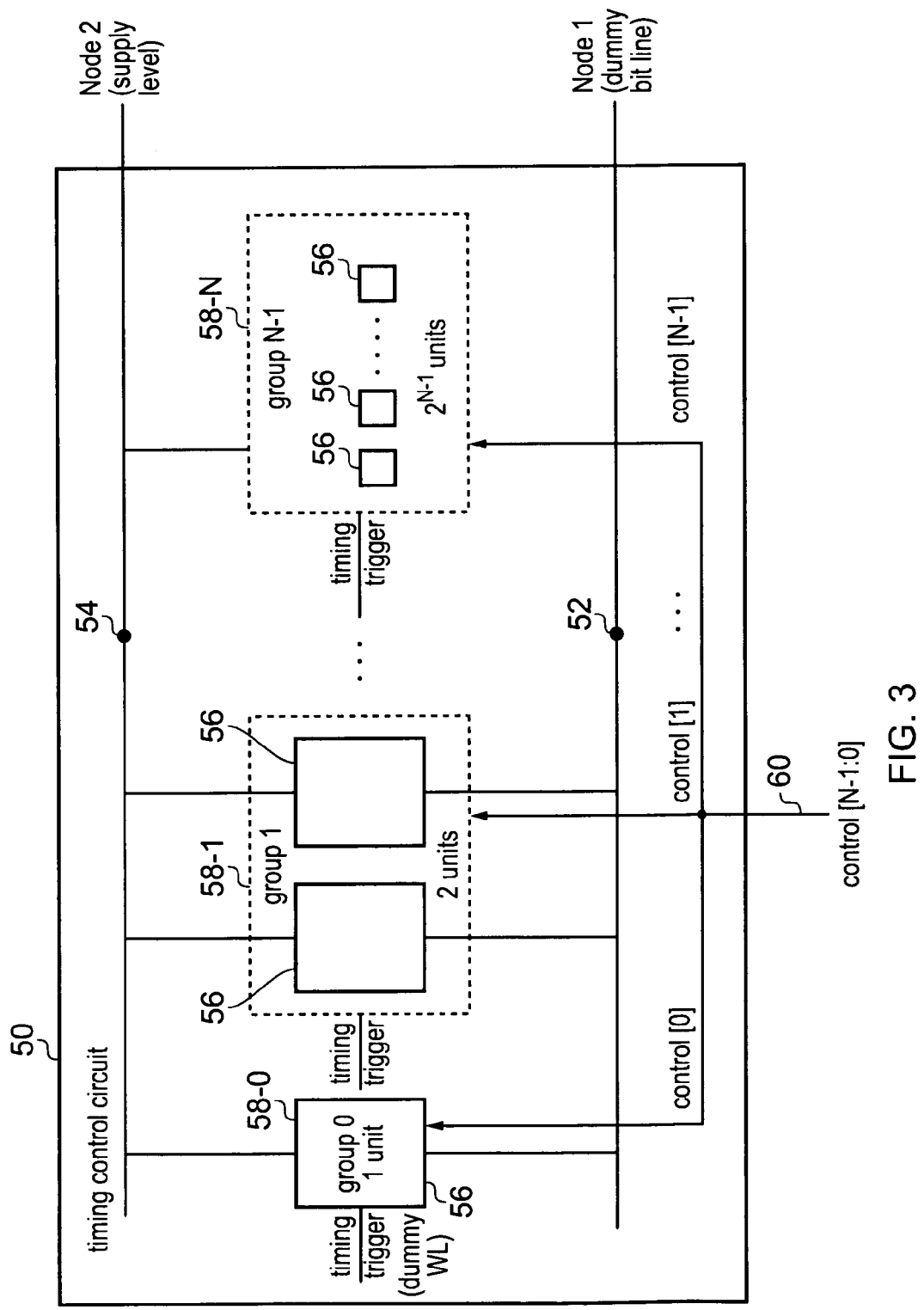
FIG. 3 schematically illustrates a timing control circuit for controlling a signal timing in an associated circuit in one embodiment.

FIG. 3 shows a timing control circuit 50 for controlling a signal timing of an associated circuit. One application of the timing control circuit 50 is as a dummy cell 20 within a memory 2. The timing control circuit comprises a first circuit node 52 and a second circuit node 54, which can be coupled to elements of the associated circuit whose timing is controlled by the timing control circuit 50. A number of current control units 56 are coupled between the first and second circuit nodes 52, 54. The current control units 56 can be switched between an active mode in which a current is allowed to pass between a first and second circuit nodes and an inactive mode in which current is blocked from passing between the first and second circuit nodes 52, 54. When a timing trigger event occurs, then any current control units 56 that are in the active mode pass a current between the first and second circuit nodes 52, 54. The magnitude of the current is dependent on the number of current control units 56 that are currently in the active mode (although there may be a very small amount of current leakage through a current control unit in the inactive mode, this leakage does not contribute significantly to the total current magnitude). The first or second circuit nodes 52, 54 may be connected to a circuit element of the associated circuit such that that circuit element is charged or discharged in dependence on the magnitude of the current passing through the current control units 56. The rate at which that element is charged can be used to trigger the signal timing in the associated circuit.

The current control units 56 are grouped into several groups 58-0, 58-1, . . . , 58-N. At least some of the groups have different numbers of current control units 56. At least one of the groups has more than one current control unit 56. In the embodiment of FIG. 3, the numbers of current control units 56 comprised by successive groups 58 increases in powers of 2 so that the respective groups comprise 1, 2, 4, . . . , $2^{N-1}$ current control units 56.

Each group 58 of current control units is switched collectively between the active and inactive modes in dependence on a corresponding bit of a control value 60 that is input to the timing control unit 50. For example, bit [0] may control whether the $0^{th}$ group 58-0 is in the active mode or the inactive mode, bit [1] may control whether the first group 58-1 is in the active or inactive mode, and so on. In the embodiment of FIG. 3, the control value 60 is a binary number whose value represents the total number of current control units 56 that are to be placed in the active mode at one time. A bit value of 0 indicates that the corresponding group is to be placed in the inactive mode, while a bit value of 1 indicates that the corresponding group is to be placed in the active mode.

For example, if N=4, then there are four groups of current control units comprising 1, 2, 4 and 8 current control units respectively. The control value is then a 4-bit binary value [3:0] indicating which groups are placed in the active or inactive mode. Table 1 below shows which current control units are placed in the active or inactive modes for each potential value of the control value:

TABLE 1

| Control value [3:0] | Group 3 (8 units) | Group 2 (4 units) | Group 1 (2 units) | Group 0 (1 unit) | Total active units |
|---|---|---|---|---|---|
| 0000 | Inactive | Inactive | Inactive | Inactive | 0 (unused) |
| 0001 | Inactive | Inactive | Inactive | Active | 1 |
| 0010 | Inactive | Inactive | Active | Inactive | 2 |
| 0011 | Inactive | Inactive | Active | Active | 3 |
| 0100 | Inactive | Active | Inactive | Inactive | 4 |
| 0101 | Inactive | Active | Inactive | Active | 5 |
| 0110 | Inactive | Active | Active | Inactive | 6 |
| 0111 | Inactive | Active | Active | Active | 7 |
| 1000 | Active | Inactive | Inactive | Inactive | 8 |
| 1001 | Active | Inactive | Inactive | Active | 9 |
| 1010 | Active | Inactive | Active | Inactive | 10 |
| 1011 | Active | Inactive | Active | Active | 11 |
| 1100 | Active | Active | Inactive | Inactive | 12 |
| 1101 | Active | Active | Inactive | Active | 13 |
| 1110 | Active | Active | Active | Inactive | 14 |
| 1111 | Active | Active | Active | Active | 15 |

The table shows how a regularly spaced sequence of numbers of active current control units 56 can be provided by switching different combinations of groups 58 of current control units into the active mode in dependence on the control value 60. As the number of active current control units 56 increases, the magnitude of the current flowing between the circuit nodes 52, 54 increases, and so any circuit element being charged or discharged by this current will reach a threshold voltage more rapidly, reducing the delay between the timing trigger event and the generation of the reference timing. Conversely, the fewer active current control units 56, the larger the delay between the timing trigger event and the generation of the reference timing.

In an alternative embodiment the binary value may represent how many current control units 56 are to be placed in the inactive mode. In this case, a bit value of 0 indicates that the corresponding group 58 is to be placed in the active mode and a bit value of 1 indicates that the corresponding group is to be placed in the inactive mode.

In the embodiment of FIG. 3, the state where all groups 58 are inactive would not normally be used since in this case current would not flow between the circuit nodes 52, 54 and so a reference timing could not be generated. However, as shall be explained later with reference to FIG. 8, this state may become useful if a fixed current control unit is provided which passes current in response to the trigger event independently of the value of the control value.

Figure 4:
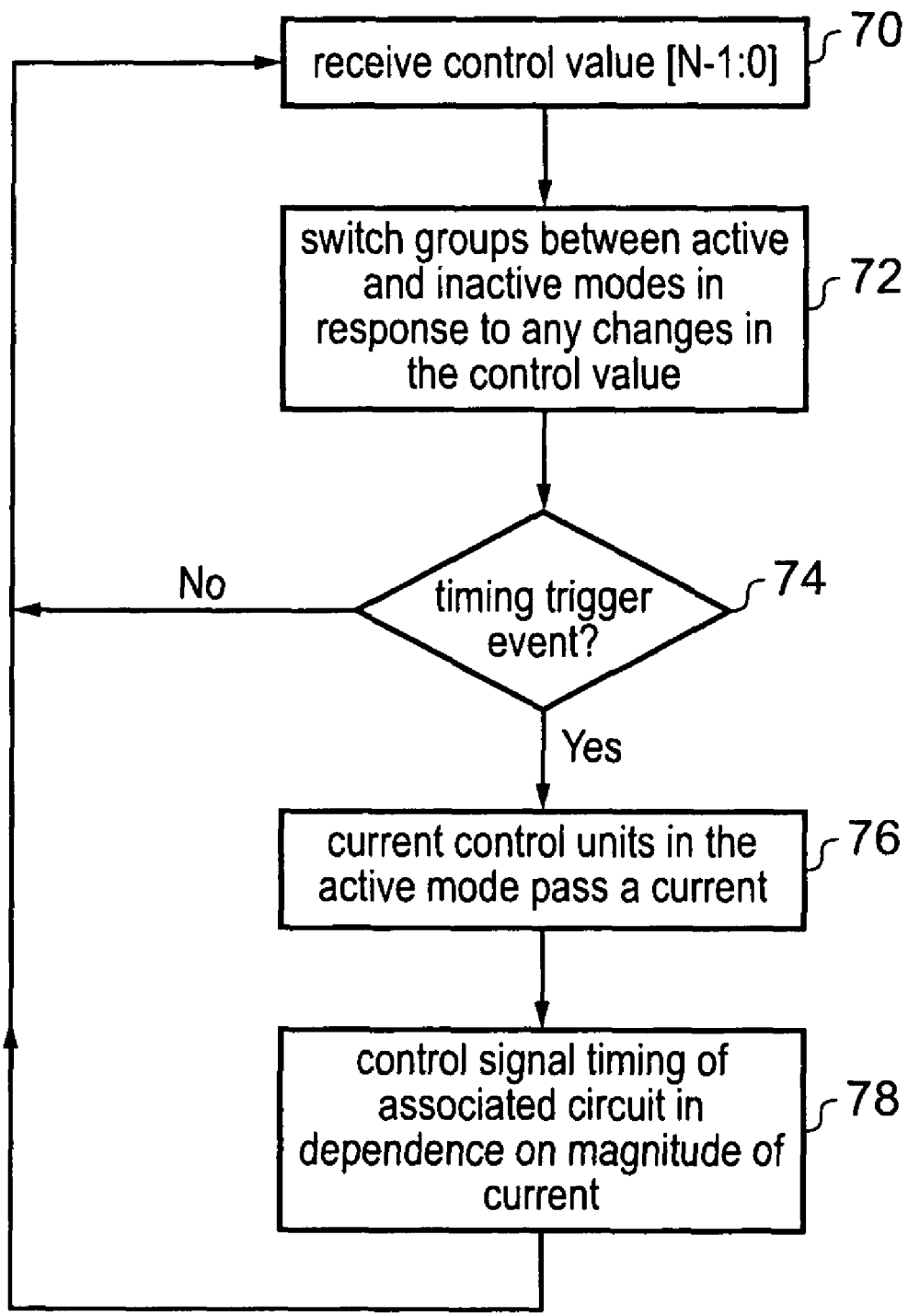
FIG. 4 illustrates a method of controlling signal timing in an associated circuit in one embodiment.

FIG. 4 schematically illustrates a method of controlling signal timing of an associated circuit using a timing control circuit as shown in FIG. 3. At step 70, the control value 60 is received. The control value has N bits [N−1:0]. Each bit of a control value corresponds to one of the groups 58 of current control units 56. At step 72, the groups 58 are switched between active and inactive modes in response to any changes in control value 60. For example, if a bit [j] of the control value 60 has a value of 1 then the corresponding group 58-j is placed in the active mode while if bit [j] has a value of 0 then the $j^{th}$ group 58-j is placed in the inactive mode.

At step 74, it is determined whether or not the timing trigger event has occurred. If no timing trigger event has occurred then the method returns to step 70 where the control value is checked once more.

When a timing trigger event occurs at step 74, then the method proceeds to step 76 where the current control units that are currently in the active mode according to the control value 60 pass a current between the first and second circuit nodes 52, 54 in response to the timing trigger event. The magnitude of this current is dependent on how many of the current control units 56 are in the active mode (i.e. which combination of groups of current control units are active).

At step 78, a signal timing within the associated circuit is controlled in dependence on the magnitude of the current passing through the active current control units 56. The signal timing may be controlled in a number of ways. For example, one of the first and second circuit nodes 52, 54 may be charged or discharged by the current. The signal timing can be triggered depending on when one of the first and second nodes is charged or discharged beyond a threshold amount. The greater the number of active current control units 56, the quicker the rate of charging or discharging of one of the circuit nodes and hence the earlier the reference timing is triggered. Hence the delay between the timing trigger event and the generation of the reference timing can be adjusted depending on the control value After step 78, the method of FIG. 4 returns to step 70 where the control value is checked once more.

The timing control circuit 50 is suitable for use in the dummy loop circuit shown in FIG. 1. In this case, the timing control circuit 50 is provided within the dummy cell 20. The first circuit node 52 is coupled to the dummy bit line 24. The second circuit node 54 is coupled to a supply level. The timing trigger event can be initiated by the assertion of the dummy word line 22. In this case, assertion of the dummy word line 22 causes a discharge current to pass through any current control units 56 that are in the active mode. The discharge current causes the dummy bit line 24 coupled to the first circuit node 52 to be discharged to the supply level of the second circuit node 54. The rate of the discharge is dependent on the number of active current control units 56. The dummy sense amplifier 26 detects when the dummy bit line 24 has been discharged beyond a threshold level and at this point triggers the reference timing within the memory. By varying which groups 58 of current control units 56 are active in the way described above, the reference timing for the memory is adjusted.

Figure 5:
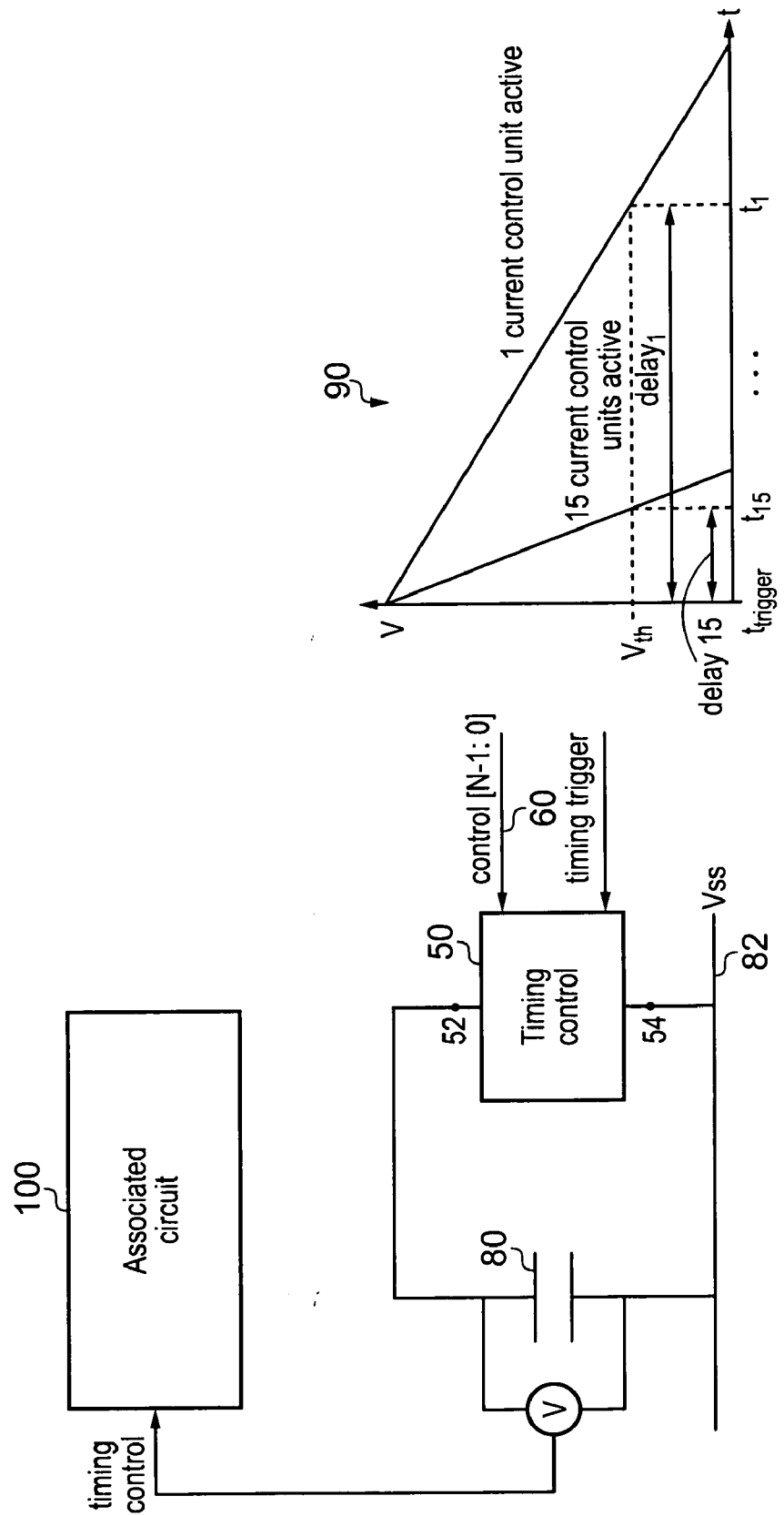
FIG. 5 schematically illustrates controlling the signal timing in the associated circuit in dependence on a rate of discharge of a capacitive element by a current passed by the timing control circuit according to one embodiment.

FIG. 5 shows another example of the timing control circuit 50 being used for controlling a signal timing in an associated circuit. One of the circuit nodes 52, 54 (for example the first circuit node 52) of the timing control circuit 50 is coupled to a capacitive element 80 (which may be a capacitor or any other circuit element having capacitance). The other circuit node (for example the second circuit node 54) is coupled to a supply level 82. The capacitive element 80 is also coupled to the supply level 82.

When a timing trigger signal is received by the timing control circuit 50, any groups 58 of current control units 56 that are currently in the active mode pass a current between the capacitive element 80 and the supply level 82. The current acts to discharge the capacitor 80 towards the supply level. The magnitude of the discharge current is dependent on which combination of groups are placed in the active mode in response to the control signal 60. The greater the magnitude of the discharge current, the greater the rate of discharge of the capacitive element 80 and so the greater the drop in voltage difference across the capacitive element 80. When the voltage difference drops below a threshold level $V_{th}$ then the signal timing in the associated circuit 100 is triggered.

Graph 90 of FIG. 5 illustrates how the signal timing varies when different numbers of current control units are active. For example, when there are four groups of current control units comprising 1, 2, 4 and 8 current control units respectively, then the number of active units can be varied between 1 and 15. The delay between the time $f_{trigger}$ of the trigger event and the time $t_1, \ldots, t_{15}$ when the threshold voltage level $V_{th}$ is passed varies between delay$_1$ and delay$_{15}$ in dependence on the number of active current control units.

It will be appreciated that in an alternative embodiment the capacitive element 18 may be charged by the current passing through the timing control circuit 50 rather than discharged. In this case, the signal timing can be triggered when the voltage difference across the capacitive element 80 rises above a threshold level.

Figure 6:
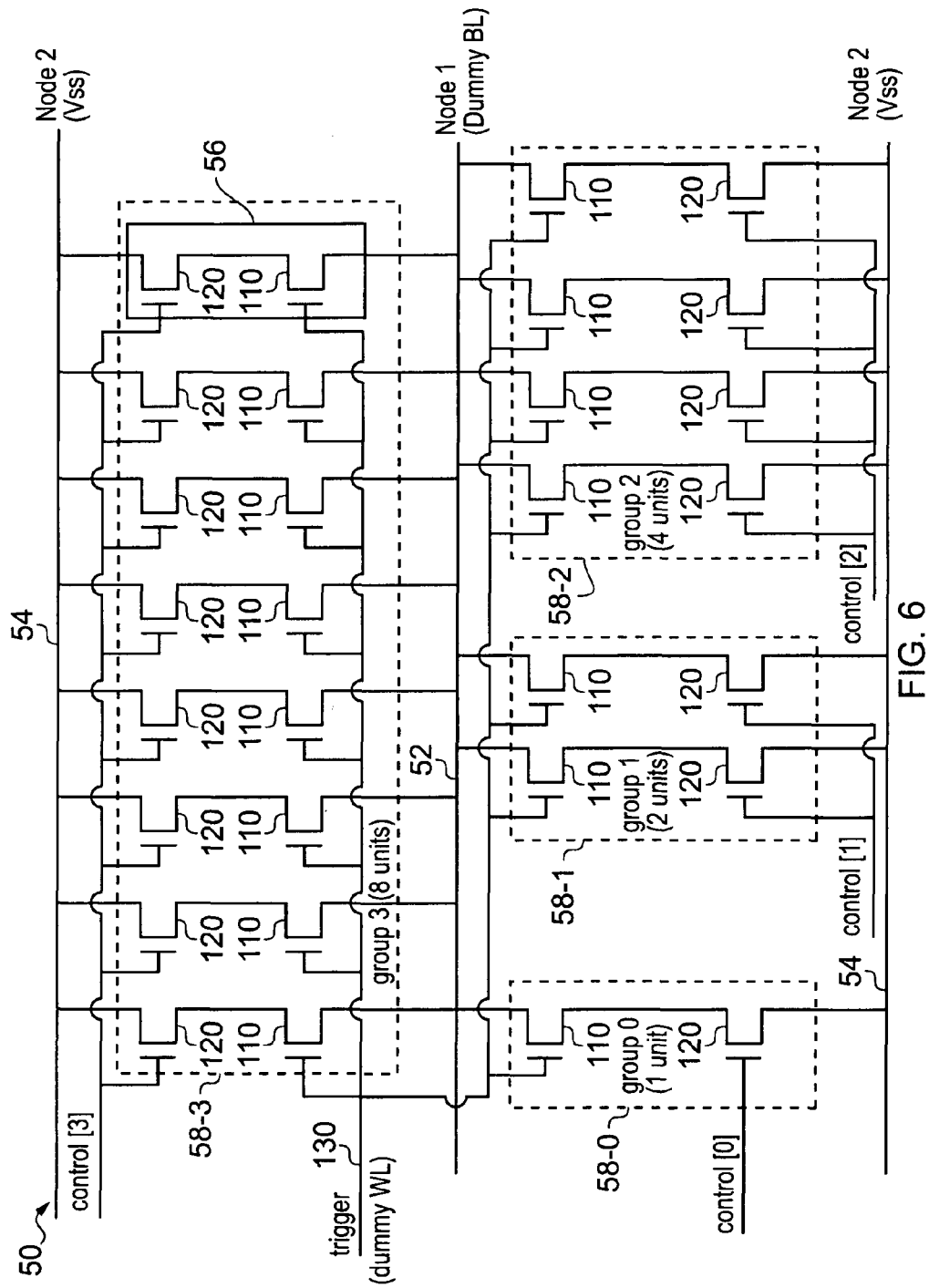
FIG. 6 schematically illustrates a timing control circuit for controlling a signal timing in an associated circuit, in which each current control unit has its own control transistor according to one embodiment.

FIG. 6 shows another example of a timing control circuit 50. In this example, there are four groups 58-0 to 58-3 of current control units 56. Each current control unit 56 comprises a trigger transistor 110 and a control transistor 120. The control transistor 120 controls whether the current control unit is in the active mode or the inactive mode. When control transistor 120 is in a conductive state then the corresponding current control unit 56 is in the active mode and when the control transistor 120 is in a non-conductive state then the corresponding current control unit is in the inactive mode. All the control transistors 120 within the same group are switched in response to the bit of the control value that corresponds to that group. Hence, all current control units within a same group are switched together between the active and inactive modes.

The trigger transistor 110 of each current control unit is coupled to a trigger signal 130. When the trigger event occurs then the trigger signal 130 is asserted to turn on the trigger transistors 110 of each current control unit. This causes the current to flow between the first and second circuit nodes 52, 54 via any current control unit that is in the active mode (i.e. whose control transistor 120 is in the conductive state). Hence the first circuit node 52 is discharged through the active current control units to the supply level of the second circuit node 54 at a rate dependent on how many of the current control units are in the active mode.

In the example of FIG. 6, the timing control circuit is provided with two second circuit nodes 54, with some groups 58-0, 58-1, 58-2 of current control units being coupled to one second circuit node 54 and another group 58-3 being coupled to the other second circuit node. Providing separate circuit nodes in this way can in some instances make the timing control circuit 50 more compact than if all of the groups of current control units had been connected in a line between the first circuit node 52 and a single second circuit node 54.

In the example of FIG. 6, the groups of current control units comprise 1, 2, 4 and 8 current control units respectively. However, other numbers of groups and numbers of current control units are possible. For example in FIG. 7 the timing control circuit comprises three groups comprising 1, 2 and 4 current control units.

Figure 7:
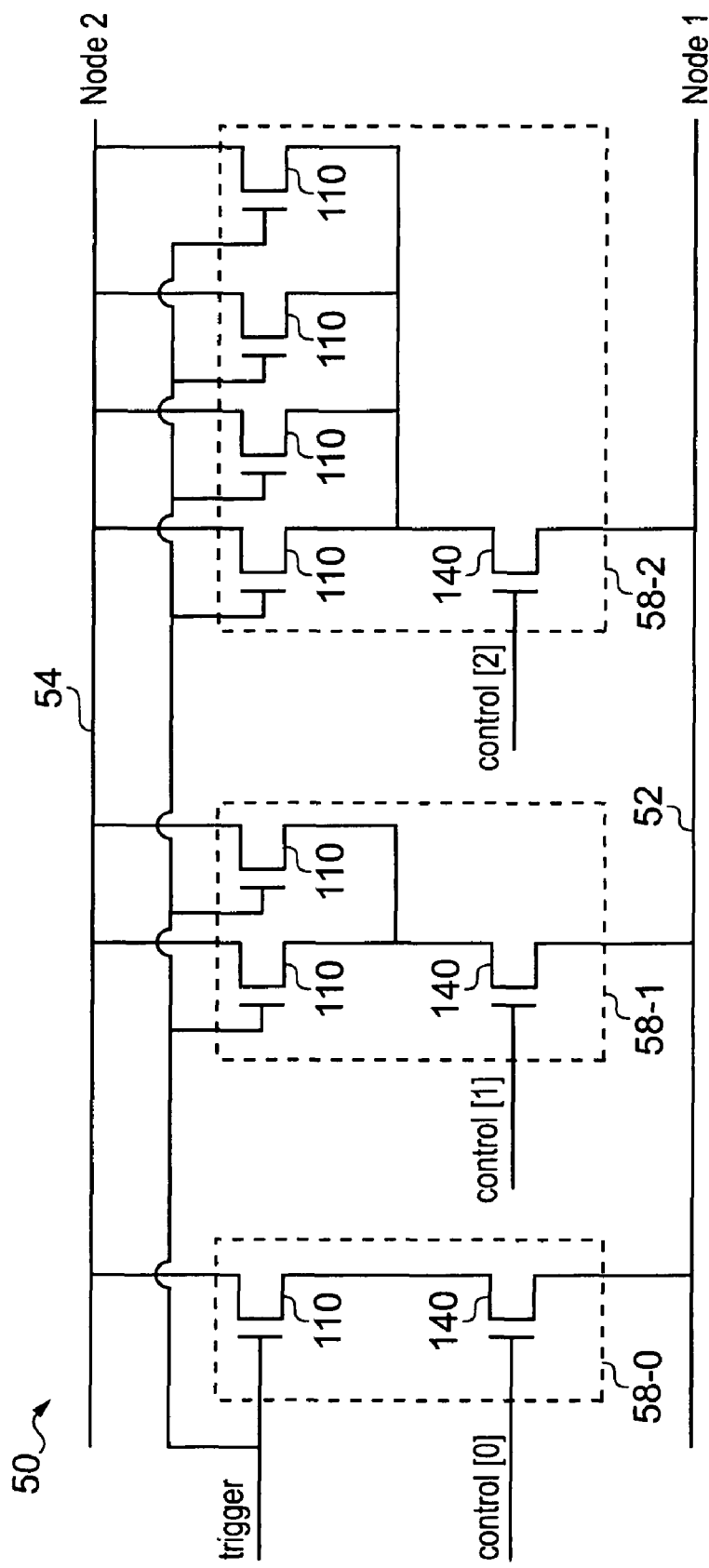
FIG. 7 schematically illustrates an embodiment of a timing control circuit in which different control units within each group share a common control transistor.

In the embodiment of FIG. 6, each current control unit 56 has both a control transistor 120 and a trigger transistor 110. However, it is also possible to provide a shared control transistor 140 which is shared between all current control units within a same group 58. FIG. 7 shows such an example. Each current control unit comprises a trigger transistor 110 and a control transistor 140 which is shared between all current control units of the same group. Thus the shared control transistor 140 switches all the current control units of the group between the active and inactive modes in dependence on the bit of the control value that corresponds to that group.

The present technique uses fewer transistors than in previously known timing control circuits. Whereas the 4:16 decoder of previous systems used around 136 transistors to provide 16 levels of timing control, FIG. 6 uses only 30 transistors to provide 15 levels of timing control. If a shared control transistor 140 (as shown in FIG. 7) was used in the embodiment of FIG. 6, then the number of transistors could be reduced further to 19 (15 trigger transistors for the 15 current control units, and 4 control transistors for the 4 groups 58-0 to 58-3). Hence, a similar level of control can be provided with significantly fewer transistors than in previously known systems.

Figure 8:
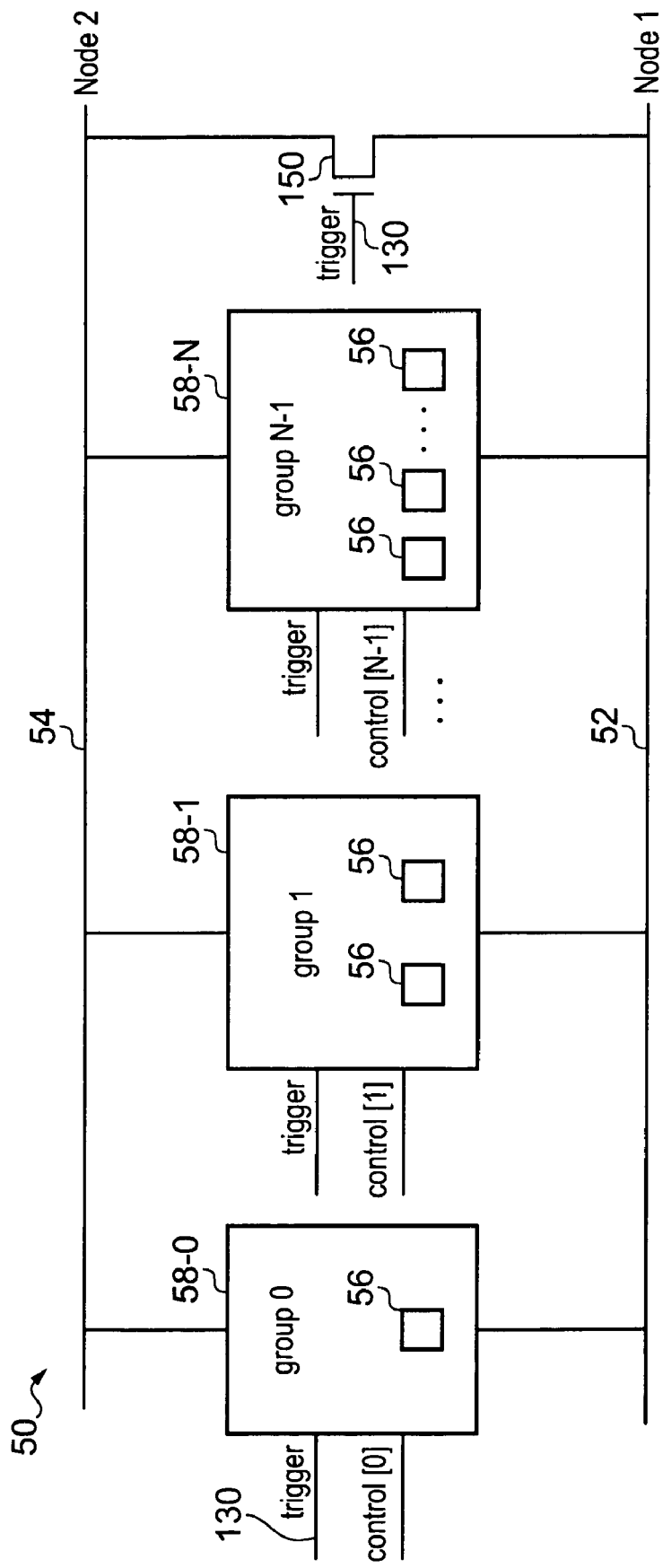
FIG. 8 illustrates an embodiment of a timing control circuit comprising a fixed current control unit for passing current independently of whether other current control units are currently active or inactive.

In embodiments described previously herein, all current control units are operable in both the active and inactive modes. However, it is also possible to provide one or more current control units which are fixed in the active mode so that they always respond to the trigger event by passing a current between the first and second circuit nodes 52, 54. FIG. 8 shows such an embodiment. A fixed current control unit 150 is coupled in parallel with the respective groups 58-0, . . . , 58-N of current control units. The fixed current control unit 150 responds to the trigger event by entering a conductive state which allows current to pass between the first and second circuit nodes. Hence, even when all of the groups 58 of current control units are switched into the inactive mode, a current will still pass between the first and second circuit nodes when the trigger event occurs. This allows the value of the control value 60 that corresponds to all the groups being inactive (e.g. the 0b0000 value shown in Table 1 above) to provide a further option for adjusting the signal timing, hence widening the range within which the signal timing can be varied. Thus, by including a fixed current control unit 150 in the embodiment of FIG. 6, for example, the number of levels of timing control may be increased from 15 to 16.

In the examples of FIGS. 6 and 7, the control transistors 120, 140 are n-type transistors that are placed in a high conductance state in response to a high-logic ("1") state of the corresponding bit of the control value and are placed in a low conductance state in response to a low-logic ("0") state of the corresponding bit. Hence, in this embodiment a "1" bit indicates an active group of current control units and a "0" bit indicates an inactive group of current control units. This means that the binary value of the control value 60 indicates the number of active current control units.

In an alternative embodiment, p-type transistors may be provided as the control transistors 120, 140. In this case, a "0" bit would control the p-type control transistors 120, 140 to be in a high conductance state corresponding to the active mode of the current control unit, and a "1" bit would control the control transistors 120, 140 to be in a to low conductance state corresponding to the inactive mode. In this case, the binary value of the control value 60 would indicate the total number of inactive current control units.

Figure 9:
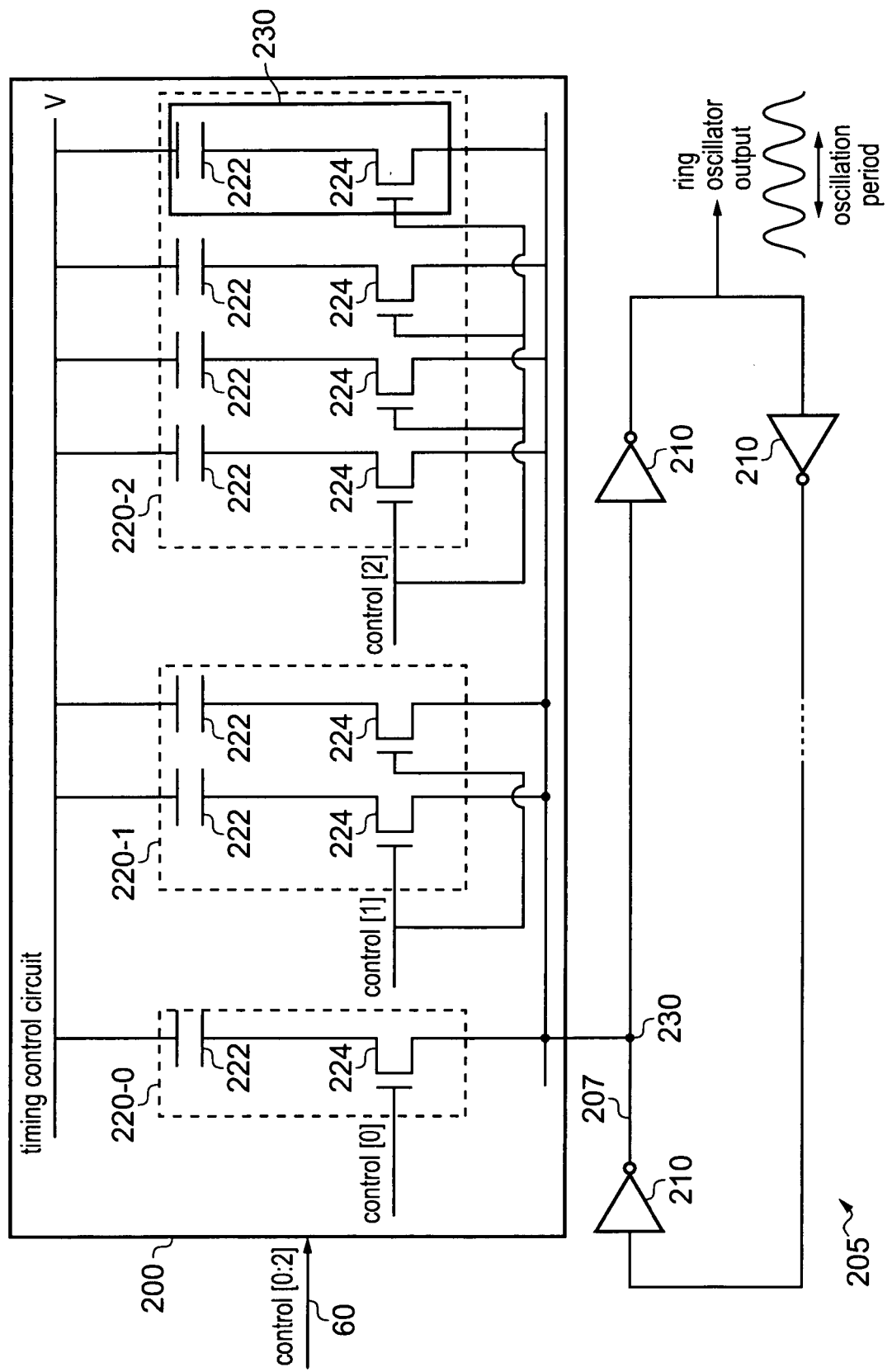
FIG. 9 illustrates a timing control circuit for regulating the oscillation period of a ring oscillator according to one embodiment.

FIG. 9 shows another embodiment of timing control circuit 200 which can be used to regulate an oscillation period of a signal within a ring oscillator circuit 205. The ring oscillator circuit 205 comprises a signal path 207 which is arranged in a ring such that signals can cycle round and round the ring. There are an odd number of inverters 210 along the signal path 207, which means that as the signal propagates through the chain of inverters 210 the signal value at any particular point of the signal path 207 will oscillate between high and low values. While FIG. 9 shows the signal path 207 comprising three inverters, it will be appreciated that typically a greater number of inverters 210 are provided.

The timing control circuit 200 is coupled to a given point 230 on the signal path 207. The timing control circuit 200 is tuneable so as to vary the amount of current that is drawn from the signal path 207 at point 230. The greater the magnitude of the current that is drawn by the timing control circuit 200 from the ring oscillator 205, the smaller the amount of current that remains flowing in the signal path 207 and so the slower the rate of charge or discharge of the inverters 210. If the inverters 210 are charged or discharged more slowly, then they will take a longer time to flip between states and so the oscillation period of the ring oscillator circuit 205 will increase.

In this embodiment, the timing control circuit 200 varies the magnitude of the current flowing from the ring oscillator by switching different groups of current control units 230 between active and inactive modes. Each current control unit 230 comprises a capacitive element 222 and a control transistor 224. Within each group 220, the control transistors 224 are responsive to a corresponding bit of the control value 60 to switch any current control units within that group to an active or inactive state in dependence on the bit.

Following a rising edge transition of the point 230 of the signal path 207, then a current will be passed by any active current control units 230 to charge the capacitive elements 220 of those active current control units. This diverts current away from the ring oscillator circuit 205. The magnitude of the current charging the capacitive elements 222 is increased or decreased according to the number of active current control units. The greater the number of active current control units, the longer the oscillation period of the ring oscillator 205.

Following a falling edge transition of point 230 of the signal path 207, the charge accumulated at the capacitive elements 222 is dissipated.

While FIG. 9 shows an embodiment in which the current control units each have a control transistor 224, FIG. 9 may also be modified such that a shared control transistor is provided for each group, in a similar way to the embodiment shown in FIG. 7.

While the embodiments described so far have used groups of current control units having numbers of current control units that scale in a binary fashion, this is not essential. The respective groups may have arbitrary numbers of current control units, as long as there are at least two different groups with different numbers of current control units. Control value 60 comprises a bit for each group which controls whether the corresponding group is in the active or inactive states.

For example, four groups may comprise 5, 3, 1 and 1 current control units respectively. A 4-bit control value may then control different numbers of current control units to be placed in the active mode as shown in Table 2 below:

TABLE 2

| Control value [3:0] | Group 3 (5 units) | Group 2 (3 units) | Group 1 (1 units) | Group 0 (1 unit) | Total active units |
|---|---|---|---|---|---|
| 0000 | Inactive | Inactive | Inactive | Inactive | 0 (unused) |
| 0001 | Inactive | Inactive | Inactive | Active | 1 |
| 0010 | Inactive | Inactive | Active | Inactive | 1 |
| 0011 | Inactive | Inactive | Active | Active | 2 |
| 0100 | Inactive | Active | Inactive | Inactive | 3 |
| 0101 | Inactive | Active | Inactive | Active | 4 |
| 0110 | Inactive | Active | Active | Inactive | 4 |
| 0111 | Inactive | Active | Active | Active | 5 |
| 1000 | Active | Inactive | Inactive | Inactive | 5 |
| 1001 | Active | Inactive | Inactive | Active | 6 |
| 1010 | Active | Inactive | Active | Inactive | 6 |
| 1011 | Active | Inactive | Active | Active | 7 |
| 1100 | Active | Active | Inactive | Inactive | 8 |
| 1101 | Active | Active | Inactive | Active | 9 |
| 1110 | Active | Active | Active | Inactive | 9 |
| 1111 | Active | Active | Active | Active | 10 |

When the number of current control units in each group does not scale in a binary fashion then there may be multiple encodings of the control value that result in the same number of active current control units. For example, FIG. 10 shows that the values 0001 and 0010 both result in one active current control unit.

In addition to the above described embodiments, the present technique may also be used in a memory compiler for compiling a memory design. The memory compiler can produce a memory design wherein a memory array is provided with a dummy loop circuit for controlling a reference timing in a memory according to the present techniques. FIG. 10 schematically illustrates a general purpose computer 300 of the type that may be used to implement the memory compiler.

The general purpose computer 300 includes a central processing unit 302, a random access memory 304, a read only memory 306, a network interface card 308, a hard disk drive 310, a display driver 312 and monitor 314 and a user input/output circuit 316 with a keyboard 318 and mouse 320 all connected via a common bus 322. In operation the central processing unit 302 will execute computer program instructions that may be stored in one or more of the random access memory 304, the read only memory 306 and the hard disk drive 310 or dynamically downloaded via the network interface card 308. The results of the processing performed may be displayed to a user via the display driver 312 and the monitor 314. User inputs for controlling the operation of the general purpose computer 300 may be received via the user input output circuit 316 from the keyboard 318 or the mouse 320. It will be appreciated that the computer program could be written in a variety of different computer languages. The computer program may be stored and distributed on a recording medium or dynamically downloaded to the general purpose computer 300. When operating under control of an appropriate computer program, the general purpose computer 300 acts as the memory compiler for compiling a memory design according to the above described techniques. The architecture of the general purpose computer 300 could vary considerably and FIG. 10 is only one example.

Figure 10:
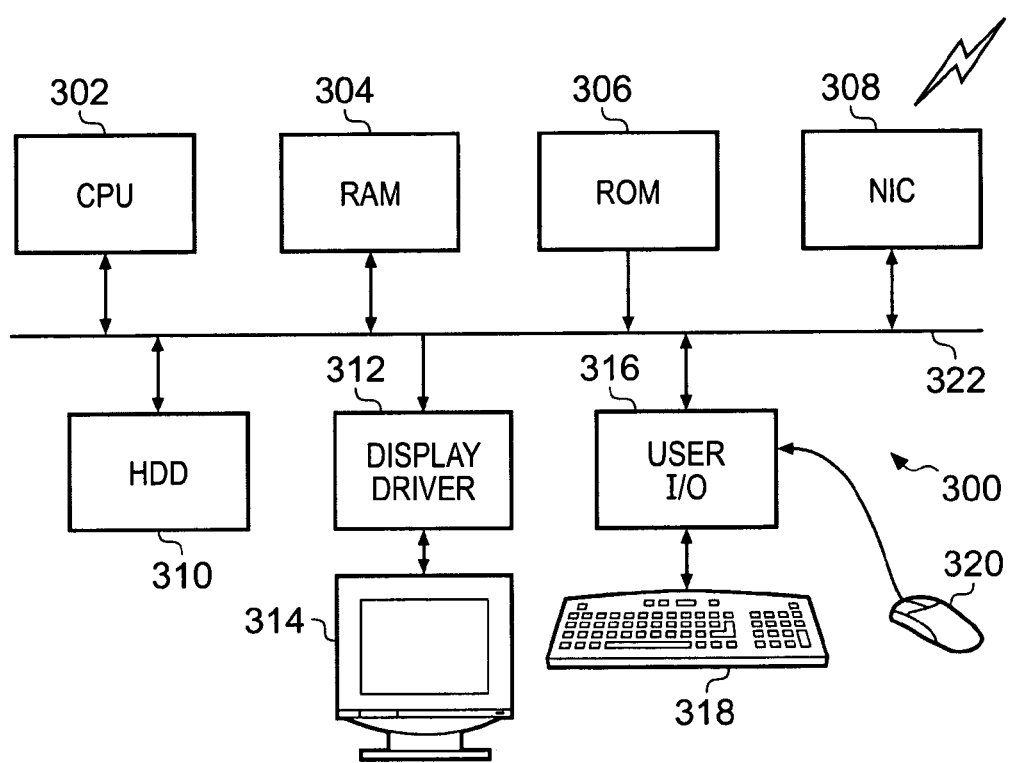
FIG. 10 illustrates a system for executing a memory compiler for compiling memory designs according to the present technique.

Alternatively, the memory compiler may be implemented in a more distributed fashion, wherein the general purpose computer 300 illustrated in FIG. 10 may be expanded and/or replaced by an infrastructure comprising components implemented on separate physical devices, the separate physical devices sharing the processing required to carry out these techniques. Such separate physical devices may be physically proximate to one another, or may even be located at entirely different physical locations. In some configurations such an infrastructure is termed a 'cloud computing' arrangement.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A timing control circuit for controlling a signal timing in an associated circuit, the timing control circuit comprising:
   a first circuit node;
   a second circuit node;
   a control input for receiving a control value; and
   at least three current control units coupled in parallel between said first circuit node and said second circuit node, said current control units being responsive to a timing trigger event to pass a current, said signal timing of said associated circuit being dependent on a magnitude of said current; wherein:
   said current control units each have an active mode and an inactive mode, said magnitude of said current being dependent on how many of said current control units are in said active mode at the time of said timing trigger event;
   said current control units comprise a plurality of groups of current control units, at least two of said groups having different numbers of current control units, at least one of said groups comprising more than one current control unit;
   said control value comprises a plurality of bits corresponding to said plurality of groups of current control units; and
   current control units within a same group are responsive to a change in a bit of said control value corresponding to that group to switch together between said active mode and said inactive mode, such that said magnitude of said current is dependent on which of said groups of current control units are in said active mode at the time of said timing trigger event.

2. The timing control circuit according to claim 1, wherein said plurality of groups comprise N groups of current control units, and a $j^{th}$ group of said N groups comprises $2^j$ current control units, where $0 \leq j \leq N-1$.

3. The timing control circuit according to claim 2, wherein said control value comprises N bits [N−1:0], and said $j^{th}$ group is controlled to be in said active mode or said inactive mode in dependence on a $j^{th}$ bit of said control value.

4. The timing control circuit according to claim 1, further comprising at least one further current control unit coupled in parallel with said at least three current control units between said first circuit node and said second circuit node, said further current control unit being configured to pass a further current independently of said control value.

5. The timing control circuit according to claim 1, wherein said current is a charging current passing between said first and second circuit nodes.

6. The timing control circuit according to claim 1, wherein said current is a discharge current passing between said first and second circuit nodes.

7. The timing control circuit according to claim 6, wherein said second circuit node is coupled to a supply level, and said discharge current discharges said first circuit node towards said supply level when said timing trigger event occurs while at least one of said current control units is in said active mode.

8. The timing control circuit according to claim 1, wherein said first circuit node is coupled to a capacitive element, and said signal timing in said associated circuit is dependent on a rate of charge or discharge of said capacitive element by said current.

9. The timing control circuit according to claim 1, wherein said associated circuit comprises a memory and said timing control circuit comprises a dummy loop circuit for controlling a reference timing for said memory.

10. The timing control circuit according to claim 9, wherein said dummy loop circuit comprises a dummy bit line and a dummy word line;
   said first circuit node is coupled to said dummy bit line;
   said second circuit node is coupled to a supply level; and
   said timing trigger event comprises asserting said dummy word line.

11. The timing control circuit according to claim 1, wherein each current control unit comprises a trigger transistor responsive to a timing trigger signal indicating said timing trigger event to allow said current to pass between said first circuit node and said second circuit node if said current control unit is in said active mode.

12. The timing control circuit according to claim 11, wherein within a selected group of current control units, each current control unit within said selected group comprises a control transistor coupled in series with said trigger transistor and each control transistor is configured to select whether the corresponding current control unit is in said active mode or said inactive mode in dependence on the bit of said control value corresponding to said selected group.

13. The timing control circuit according to claim 11, wherein within a selected group of current control units, a shared control transistor is coupled in series with the trigger transistors of each current control unit within said selected group and said shared control transistor is configured to select whether the current control units within said selected group are in said active mode or said inactive mode in dependence on the bit of said control value corresponding to said selected group.

14. The timing control circuit according to claim 1, comprising a plurality of second circuit nodes, each of said second circuit nodes having at least one group of current control units coupled between said first circuit node and that second circuit node.

15. The timing control circuit, according to claim 1, wherein said associated circuit is a ring oscillator circuit, and said timing control circuit is a circuit for regulating an oscillation period of said ring oscillator circuit in dependence on said magnitude of said current.

16. The timing control circuit according to claim 15, wherein said first circuit node is coupled to a signal path of said ring oscillator circuit, said second circuit node is coupled to a supply level, and said timing trigger event comprises a predetermined transition of a signal value on said signal path of said ring oscillator circuit;
   each current control unit comprises a capacitive element coupled between said signal path of said ring oscillator circuit and said supply level; and
   on occurrence of said predetermined transition, the capacitive elements of current control units that are in said active mode are charged by said current such that the magnitude of said current is dependent on how many of said current control units are in said active mode.

17. The timing control circuit according to claim 16, wherein within a selected group of current control units, each current control unit within said selected group comprises a control transistor coupled in series with said capacitive element and each control transistor is configured to select whether the corresponding current control unit is in said active mode or said inactive mode in dependence on the bit of said control value corresponding to said selected group.

18. The timing control circuit according to claim 16, wherein within a selected group of current control units, a shared control transistor is coupled in series with the capacitive elements of each current control unit within said selected group and said shared control transistor is configured to select whether the current control units within said selected group are in said active mode or said inactive mode in dependence on the bit of said control value corresponding to said selected group.

19. A processing apparatus comprising a timing control circuit according to claim 1, and said associated circuit; wherein said reference timing of said associated circuit is configured to be controlled in dependence on said magnitude of said current of said timing control circuit.

20. A memory comprising a memory array and a dummy loop circuit for generating a reference timing for said memory array, said dummy loop circuit comprising:
   a dummy word line;
   a dummy bit line;
   a control input for receiving a control value; and
   at least three current control units coupled in parallel between said dummy bit line and a supply level, said current control units being responsive to assertion of said dummy word line to pass a current between said dummy bit line and said supply level; wherein:
   said current control units each have an active mode and an inactive mode, the magnitude of said current being dependent on how many of said current control units are in said active mode when said dummy word line is asserted;
   said current control units comprise a plurality of groups of current control units, at least two of said groups having different numbers of current control units, at least one of said groups comprising more than one current control unit;
   said control value comprises a plurality of bits corresponding to said plurality of groups of current control units;
   current control units within a same group are responsive to a change in a bit of said control value corresponding to that group to switch together between said active mode and said inactive mode, such that said magnitude of said current is dependent on which of said groups of current control units are in said active mode when said dummy word line is asserted; and
   said reference timing for said memory array is dependent on said magnitude of said current passed by said current control units of said dummy loop circuit.

21. A memory compiler for compiling a memory comprising a memory array and a dummy loop circuit for generating a reference timing for said memory array, said dummy loop circuit comprising:
   a dummy word line;
   a dummy bit line;
   a control input for receiving a control value; and
   at least three current control units coupled in parallel between said dummy bit line and a supply level, said current control units being responsive to assertion of said dummy word line to pass a current between said dummy bit line and said supply level; wherein:
   said current control units each have an active mode and an inactive mode, the magnitude of said current being dependent on how many of said current control units are in said active mode when said dummy word line is asserted;
   said current control units comprise a plurality of groups of current control units, at least two of said groups having different numbers of current control units, at least one of said groups comprising more than one current control unit;
   said control value comprises a plurality of bits corresponding to said plurality of groups of current control units;
   current control units within a same group are responsive to a change in a bit of said control value corresponding to that group to switch together between said active mode and said inactive mode, such that said magnitude of said current is dependent on which of said groups of current control units are in said active mode when said dummy word line is asserted; and
   said reference timing for said memory array is dependent on said magnitude of said current passed by said current control units of said dummy loop circuit.

22. A non-transitory recording medium storing program instructions for causing a computer to execute a memory compiler according to claim 21.

23. A timing control circuit for controlling a signal timing in an associated circuit, the timing control circuit comprising:
   a first circuit node;
   a second circuit node;
   control input means for receiving a control value; and
   at least three current control means, coupled in parallel between said first circuit node and said second circuit node, for passing a current in response to a timing trigger event, said signal timing of said associated circuit being dependent on a magnitude of said current; wherein:
   said current control means each have an active mode and an inactive mode, said magnitude of said current being dependent on how many of said current control means are in said active mode at the time of said timing trigger event;

said current control means comprise a plurality of groups of current control means, at least two of said groups having different numbers of current control means, at least one of said groups comprising more than one current control means;

said control value comprises a plurality of bits corresponding to said plurality of groups of current control means; and current control means within a same group are responsive to a change in a bit of said control value corresponding to that group to switch together between said active mode and said inactive mode, such that said magnitude of said current is dependent on which of said groups of current control means are in said active mode at the time of said timing trigger event.

24. A method of controlling a signal timing in an associated circuit using a timing control circuit comprising at least three current control units coupled in parallel between a first circuit node and a second circuit node, said current control units comprising a plurality of groups of current control units, at least two of said groups having different numbers of current control units, at least one of said groups comprising more than one current control unit; the method comprising:

receiving a control value comprising a plurality of bits corresponding to said plurality of groups of current control units;

in response to a change in a bit of said control value corresponding to a group of current control units, switching current control units within that group between an active mode and an inactive mode;

in response to a timing trigger event, allowing a current to be passed by the current control units that are in said active mode such that a magnitude of said current is dependent on which of said groups of current control units are in said active mode at the time of said timing trigger event; and controlling said signal timing of said associated circuit in dependence on said magnitude of said current.

* * * * *